United States Patent [19]

Holland

[11] Patent Number: 4,710,747
[45] Date of Patent: Dec. 1, 1987

[54] METHOD AND APPARATUS FOR IMPROVING THE ACCURACY AND RESOLUTION OF AN ANALOG-TO-DIGITAL CONVERTER (ADC)

[75] Inventor: Alex Holland, Mountain View, Calif.

[73] Assignee: Fairchild Semiconductor Corporation, Cupertino, Calif.

[21] Appl. No.: 731,683

[22] Filed: May 7, 1985

Related U.S. Application Data

[63] Continuation-in-part of Ser. No. 586,902, Mar. 9, 1984, abandoned.

[51] Int. Cl.⁴ ............................................. H03M 1/20
[52] U.S. Cl. ........................ 340/347 AD; 340/347 CC
[58] Field of Search ................. 318/631; 340/347 CC, 340/347 AD; 375/26

[56] References Cited

U.S. PATENT DOCUMENTS

| | | | |
|---|---|---|---|
| 3,877,022 | 4/1975 | Lehman | 340/347 AD |
| 4,187,466 | 2/1980 | Kasson | 340/347 AD |
| 4,447,803 | 5/1984 | Crosby | 340/347 AD |
| 4,524,447 | 6/1985 | Willis | 375/26 |
| 4,550,309 | 10/1985 | Hiller | 340/347 AD |

Primary Examiner—Charles D. Miller
Attorney, Agent, or Firm—Bruce D. Riter; Theodore S. Park; Charles E. Krueger

[57] ABSTRACT

A system for increasing the accuracy and resolution of an ADC comprising a digital filter connected to the output of the ADC, a system clock for providing a digital filter clock signal, a low/pass filter/amplifier for generating a large-scale, rapidly varying dither signal fdrom the digital filter clock signal, and a summing circuit for adding the dither signal to a test signal connected to the input of the ADC.

11 Claims, 6 Drawing Figures

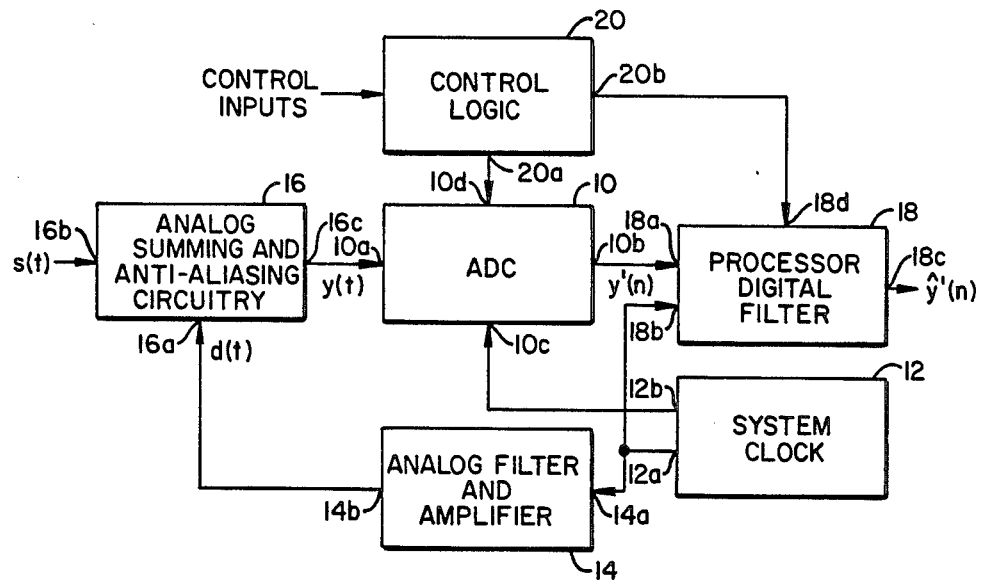
FIG._1.
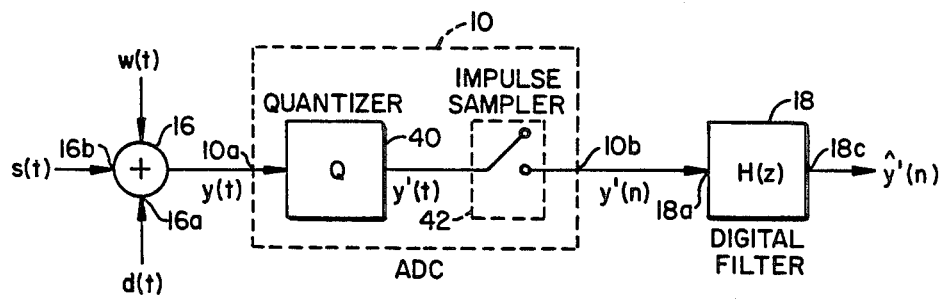
FIG._2.

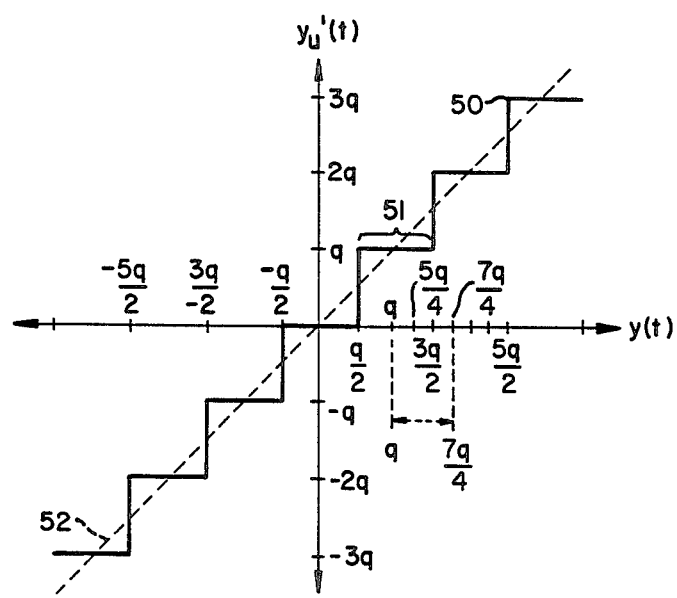
FIG._3.

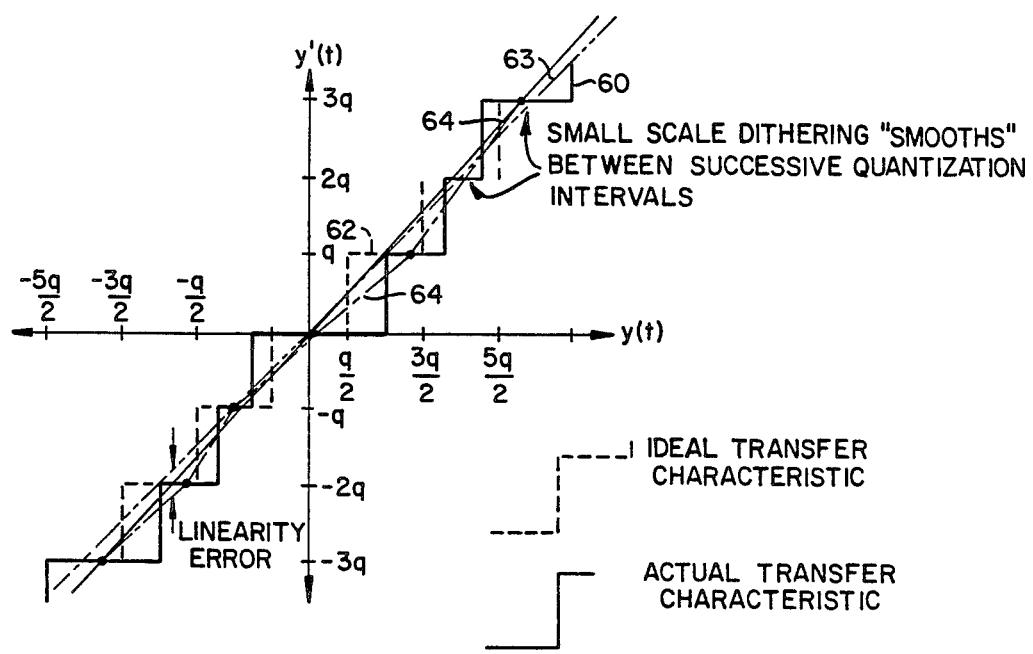
FIG._4.
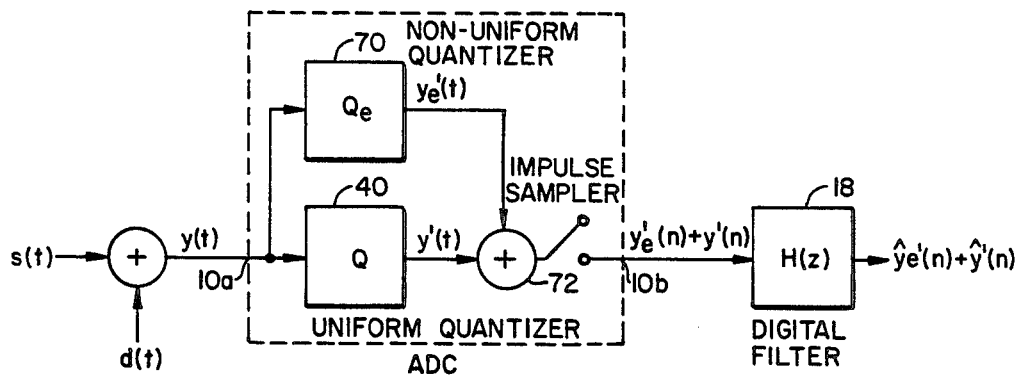
FIG._5.
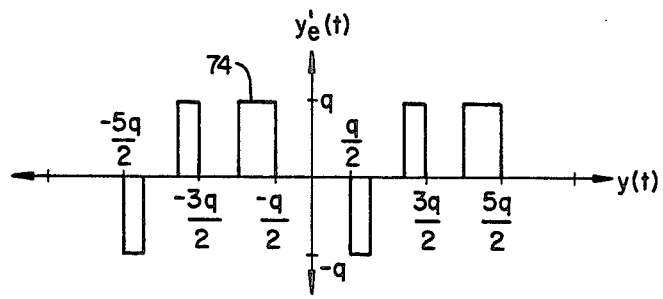
FIG._6.

1

METHOD AND APPARATUS FOR IMPROVING THE ACCURACY AND RESOLUTION OF AN ANALOG-TO-DIGITAL CONVERTER (ADC)

This application is a continuation-in-part of U.S. patent application Ser. No. 586,902 filed Mar. 9, 1984, now abandoned.

BACKGROUND OF THE INVENTION

The present invention relates generally to analog to digital converters and, more particularly, relates to a system for improving the accuracy and resolution of an analog to digital converter.

Digital processing of analog signals becomes an increasingly attractive alternative to analog processing as digital hardware becomes increasingly faster, more sophisticated, and more integrated. Also, digital systems are, in general, inherently more flexible and less sensitive to time and temperature than analog systems and can simulate almost ideal linear systems. As a result, a great effort has gone into the development of analog to digital converters (ADC's) and digital to analog converters (DAC's) for transforming an analog signal to a digital representation of that signal, or vice versa, with ever-increasing accuracy, speed, and resolution.

In the process of analog to digital conversion an analog input signal is allowed to vary continuously over a finite amplitude range and is mapped to a finite number of discrete amplitudes (amplitude quantization) and then sampled at a uniform sampling rate. The input signal dynamic range of the ADC is divided into a specified number of possible discrete amplitudes (quantization levels), where the number of discrete amplitude levels specifies the resolution of the ADC. An ADC having $2^m$ quantization levels generates an m-bit digital output signal where the value of m defines the resolution of the ADC.

An important characteristic of an ADC is its linearity (or accuracy), which is a measure of the variance of the ADC transfer characteristic, i.e., the characteristic mapping the input signal to the corresponding output signal, from a straight line.

In many measurement applications conversion of a slowly varying signal is required. For these applications, high accuracy and resolution are the most important system specifications while high speed is less critical.

Most existing systems for increasing the accuracy and resolution of an ADC stress analog domain methods to minimize the error due to the presence of internal and external noise sources, and to maximize the accuracy and the time and temperature stability of the analog components in the ADC. Other systems that have used digital processing after conversion have required complicated analog preprocessing.

It is also a known technique to add a small scale dither signal to the ADC input signal to increase the resolution of the ADC. However, a small scale dither does not increase the linearity of the ADC.

SUMMARY OF THE INVENTION

The present invention is a method and system for increasing the accuracy and resolution of an ADC that utilizes digital processing after conversion and uncomplicated analog preprocessing circuitry.

The system adds a known, rapidly varying signal (the dither signal) to a slowly varying analog input test signal to form an analog ADC input signal. In contrast to existing small scale dither schemes, the dither signal of the present invention has an amplitude substantially covering the input signal dynamic range of the ADC. The ADC then converts this input signal into an m-bit digital ADC output signal representing the analog ADC input signal.

An ADC, having a resolution of m-bits directs an m-bit digital ADC output signal to the input of a digital filter. The digital filter processes the digital ADC output signal to remove the dither signal from the ADC output signal, and then generates an $m + \Delta m$ bit signal representing the analog test signal where $\Delta m$ is the increased resolution of the system. The addition of the dither signal to the input test signal causes the quantization noise of the ADC to be distributed over a wide bandwidth. The subsequent digital filtering of the ADC output signal reduces the quantization noise and increases resolution.

The accuracy of the ADC transfer characteristic is also increased because of the large scale dithering. The large amplitude of the dither signal approximately uniformly distributes the analog ADC input signal over a significant portion of the ADC's input dynamic range. Because of this uniform distribution the error function due to the non-linearity of the ADC is attenuated by the digital filter, thereby increasing the accuracy of the conversion. This is a significant novel function of the invention.

According to one aspect of the invention, the dither signal is generated by analog filtering the digital filter clock signal, thereby locking the frequencies of the dither signal to zeros of the digital filter. According to another aspect of the invention, the sampling frequency of the ADC is selected to be harmonically unrelated to the frequencies of the dither signal.

The present invention provides a unique system for increasing the accuracy and resolution of an ADC that relies primarily on post-conversion digital processing. The only analog preprocessing circuitry necessary is circuitry for adding the dither signal to the input test signal. Additionally, the filtering of the dither signal from the ADC output signal is accomplished by generating a dither signal with frequency components having frequencies harmonically related to the digital clock signal.

BRIEF DESCRIPTION OF THE DRAWINGS

FIG. 1 is a schematic diagram of a preferred embodiment of the present invention.

FIG. 2 is a schematic diagram modeling the operation of an analog to digital converter and pre and post processing.

FIG. 3 is a graph of an ideal ADC transfer function.

FIG. 4 is a graph depicting a non-linear ADC transfer function.

FIG. 5 is a schematic diagram modeling the generation of noise due to non-linear effects in the ADC.

FIG. 6 is a graph depicting the probability distribution function of the error due to ADC quantization noise.

DETAILED DESCRIPTION OF A PREFERRED EMBODIMENT

FIG. 1 is a block diagram of an embodiment of the present invention.

Referring now to FIG. 1, the system includes a commercially available ADC 10 which will be described more fully below with reference to FIG. 2. A system clock 12 provides a digital clock signal at a first output 12a. An analog filter/amplifier circuit 14 has a first input 14a connected with the first output 12a of the system clock 12. An output port 14b of the analog filter-/amplitude 14 is connected to a first input 16a of an analog summing circuit 16. The analog summing circuit 16 also includes a second input 16b for receiving an analog test signal and an output 16c interconnected with an input port 10a of the ADC 10. An output 10b of the ADC 10 is connected with an input 18a of a digital filter 18. The digital filter also includes a clock input 18b interconnected with the first output 12a of the system clock and an output port 18c for providing a digital filter output signal. The system clock also includes a second output 12b for providing a sampling clock signal to a timing input 10c of the ADC 10. The system also includes control logic circuitry 20 with outputs 20a and 20b connected to control inputs 10d and 18d of the ADC and processor filter 10 and 18, respectively.

A brief overview of the operation of the system will now be presented with reference to FIG. 1. The ADC 10 is characterized by an input signal dynamic range which specifies the maximum and minimum amplitudes of an input signal that can be accurately converted by the ADC 10. The system of the present invention is designed to provide an accurate measurement of the amplitude of a slowly varying DC coupled input signal. The input signal, s(t), received at the second input 16b of the analog summing circuit represents a slowly varying band limited signal.

The digital clock output signal from system clock 12 is filtered by the analog filter and amplifier circuit 14 to provide a dither signal, d(t), with energy concentrated in frequency components at frequencies harmonically related to the frequency of the system clock. This dither signal, d(t), is added to the input signal, s(t), by the analog summing circuit 16. The dither signal is selected to be rapidly varying compared to the analog test signal. The amplitude of the dither signal is selected to substantially cover the input signal dynamic range of the ADC 10.

The analog summing circuit 16 may be realized by an operational amplifier summing circuit to sum s(t) and d(t) to form an analog ADC input signal y(t). The ADC 10 then converts the analog ADC input signal to an m-bit digital ADC output signal. The digital filter 18 then processes the digital ADC output signal to produce an m+$\Delta$m bit digital filter output signal representing the analog test signal s(t).

The analog to digital converter 10 is modeled in FIG. 2. Referring now to FIG. 2, the ADC has a code of m bits including sign, which specifies the number of quantization levels ($2^m$), and is characterized by an input dynamic range, V, which specifies the difference between the maximum and minimum allowable input signal amplitudes. The ADC 10 is modeled by an amplitude quantizer 40 followed by an impulse sampler 42 with uniform sampling period, T. The analog ADC input signal, y(t) is the sum of an analog test input signal, s(t), a dither signal, d(t), and of white independent noise, w(t). The signal s(t) is band limited and the frequency content of d(t) is known and is desired to be largely outside and higher than the bandwidth of s(t). Thus, d(t) is rapidly varying compared to s(t). The output from the quantizer 40, y'(t), is an amplitude quantized representation of the analog ADC input signal, y(t). The digital ADC output signal, y'(n), is an m-bit digital signal that is routed to the input of the digital filter 18 having a transfer function H(z). The digital filter output signal, ŷ'(n), is the system's effective m+$\Delta$m bit output representing the analog test signal s(t).

FIG. 3 is a graph depicting the staircase transfer characteristic function 50 of the quantizer 40 of the ADC 10. The value of the analog ADC input signal, y(t), is plotted on the horizontal axis while the value of the ideal quantized output signal of a uniform quantizer y'$_u$(t), is determined from the vertical axis.

Each horizontal step 51 of the transfer characteristic 50 is termed a quantization window with the horizontal magnitude of the step determining the width of the quantization window. The height of each quantization window above the horizontal axis is equal to the quantization level of the window. Each window is identified by its quantization level, e.g., the qth window 51 extends from y(t)=q/2 to y(t)=3q/2. The difference between successive quantization levels is termed the quantization interval. For the transfer characteristic of the uniform quantizer the quantization levels are equal to $2^l$q where l=1, m, . . . so that all quantization intervals are equal to q and each window has a uniform width equal to q. Thus there are $2^m$ quantization levels where the identity of each quantization level is specified by an m-bit digital code.

In the quantization process, the amplitude of each sample of the continuous analog ADC input signal is located in a particular quantization window and is approximated by the quantization level corresponding to that particular window. For example, if y(t)=5q/4 then y(t) is located in the qth window and will be approximated by the value, y'(t)=q. The quantization error is defined by:

e(t)=y'(t)−y(t)

so in this case e(t)=−q/4.

Since all input signals in a given window are approximated by the same quantization level, the resolution of the ADC is determined by the width of the quantization. Since this width is inversely proportional to the number of windows, $2^m$, the resolution of the ADC is specified by the integer m.

It is a known technique to use a small scale dither signal with an amplitude ranging from a single to a few quantization intervals to interpolate the values of input signals with amplitude values between successive quantization intervals. In this context, a dither signal is a signal having a controlled amplitude and frequency that is added continuously to the analog test signal. If the amplitude of the test signal remains constant over n conversions, then a certain number of the n conversions of the signal plus dither will fall outside the quantization window of the signal alone. If these n conversions are averaged then the average will indicate the location of the signal in the window.

For example, assume that the amplitude of the test signal is 5q/4 and that the amplitude range of the dither is equal to q. The amplitude of the test signal plus dither signal will then vary from q to 7q/4 as depicted in FIG. 2. Thus, over the period of the n conversions the amplitude of the test signal plus dither will be in the qth quantization window three-fourths of the time and the 2qth quantization interval one-fourth of the time. Therefore, the average of the n conversions will indicate that the amplitude of the test signal is located in the upper half of the qth window. Accordingly, the resolution of the ADC has been improved by the averaging process.

In practice, the averaging is done by a digital filter having the capability of specifying an $m+\Delta m$ bit input signal where $\Delta m$ represents the increased resolution to the above-described averaging process. This averaging process requires that the test signal amplitude remain relatively constant during the n conversions which are averaged. Therefore, the test signal is selected to have no frequencies near or above the sampling frequency of the ADC.

The resolution improvement technique described above assumes the uniform ADC transfer characteristic curve depicted in FIG. 3. Because all windows depicted by that curve have the same width and all quantization intervals are equal, a straight line 52 connects the midpoints of the windows. Accordingly, the ideal uniform characteristic is a linear transfer characteristic.

In FIG. 4 a non-liner transfer characteristic, $y'(t)$, characterizing a realizable ADC is depicted by the solid line 60. The ideal transfer characteristic, $y'_u(t)$, is depicted by the dotted line 62. Note that the midpoints of the windows of the quantization curve 64 may no longer be connected by a straight line. The non-linearity of the transfer characteristic 60 is defined as follows: A straight line 63 is drawn through the centers of the first and last steps of this transfer curve 60 of FIG. 5. Secondly, the actual centers of the transfer curve are connected by a piecewise straight line 64. The vertical distance between the straight line 63 and the piece line straight line 64 is a measure of the linearity error of the transfer function 60.

FIG. 5 is a block diagram modeling an ADC having a non-linear ADC digital output signal. The only difference between this model and that of FIG. 2 is the addition of a three-level non-linear quantizer, $Q_e$ 70, and an adder 72 for summing the output signals from $Q_e$ 70 and Q 40. The transfer characteristic function of $Q_e$ 70 is depicted in FIG. 6. The three quantization levels of $Q_e$ 70 are $+q$, 0, $-q$. The transfer characteristics of the ADC, uniform quantizer, and non-linear quantizer, $y'(t)$, $y'_u(t)$, and $y'_e(t)$ are related by the expression:

$$y'_e(t) + y'_u(t) = y'(t)$$

The non-linearity of $y'(t)$ 60 decreases the effectiveness of the small scale dither averaging process to improve resolution described above. Since the width of the windows is no longer uniform, the average of the small scale dither plus input test signal will be non-uniformly weighted according to the widths of the various windows. Thus, a system for decreasing the non-linearity or, alternatively, increasing the accuracy, of the ADC transfer curve is required. In the present invention this accuracy increase is accomplished by large scale dithering and filtering the digital ADC output signal to attenuate the non-linear transfer characteristic $y'_e(t)$ 70.

For an ADC input signal uniformally distributed over the ADC's input dynamic range the non-linear error characteristic curve, $y'_e(t)$, may be attenuated by digitally filtering the digital ADC output signal.

In the present invention the ADC input signal is uniformly distributed over the input dynamic range by adding a large-scale dither signal to the analog test signal. The addition of such a large signal to the input test signal creates several problems. The large-scale dither signal must be attenuated enough to assure that the error due to the addition of the dither signal is less than the amount of error eliminated by the system.

Additionally, the addition of the dither signal also reduces the maximum allowable amplitude of the input test signal thereby reducing the resolution of the system. However, in the present invention a system is provided for attenuating a large-scale dither signal thereby making the use of such a signal practicable for reducing non-linear quantization noise from the ADC.

In the preferred embodiment depicted in FIG. 1, the attenuation of the large-scale dither signal is accomplished by deriving the dither frequencies from the clock signal that clocks the digital filter. All filters are characterized by a transfer function characterizing the attenuation of each frequency component of a filter input signal as a function of the frequency of the component. These transfer functions have zeros at given frequencies thereby completely attenuating the frequency component of a signal at these given frequencies. Because the zeros of a digital filter may be placed at the frequency, and harmonics thereof, of the clock driving the digital filter, deriving the dither signal from the digital filter clock locks the dither frequencies to zeros of the digital filter. Additionally, the resolution reduction due to the added amplitude of the dither signal may be limited to $\Delta m = 1$ bit by limiting the amplitude of the dither signal to be less than $\frac{1}{2}$ the input dynamic range of the ADC.

The properties of a triangular wave and a sine wave large-scale dither signal are investigated in the above-referenced thesis by the inventor. It is concluded that either form of dither signal may be effectively utilized in the present invention to improve the accuracy of an ADC.

Accuracy can be further improved by selecting the ADC sampling frequency, $f_s$, to be harmonically unrelated to the frequencies of the dither signal. This selection of $f_s$ assures that the sampling will occur at points of the dither curve having different amplitudes to facilitate the averaging process of the filter.

The design of the digital filter, is not critical to the invention. Filters designed utilizing general filter theory may be utilized.

The following system components and parameters were utilized to test the system depicted in FIG. 1:

(1) The ADC was an analog 14-bit ADAM 724.

(2) The input test signal, $s(t)$, was a DC signal whose noise power within the system bandwidth was less than the variance of a 10-bit quantization interval.

(3) The dither signal, $d(t)$, was composed of a single frequency with harmonics. The fundamental was exactly 1/16 of the sampling frequency, $f_s/16 = 250$ Hz.

Accordingly, it is apparent that the system of the present provides for increased resolution and accuracy in an analog-to-digital conversion system that converts a slowly varying input test signal. Thus, the present system is exceptionally suited for applications requiring high-resolution and high-accuracy measurements of low or narrow bandwidth signals such as automatic test systems requiring super converters.

What is claimed is:

1. A system for improving the accuracy of an analog to digital converter (ADC) of the type having a specified input signal dynamic range (V), and an ADC sampling frequency ($f_s$), for receiving an analog ADC input signal at an ADC input port, for generating an m-bit digital ADC output signal, and for transferring the digital ADC output signal to an ADC output port, said system comprising:

a system clock for generating a first clock signal at a clock frequency, $f_c$, and for transferring the first clock signal to a first output port and for generating a second clock signal, at clock frequency, $f_s$, and for transferring the second clock signal to a second output port;

an analog filter/amplifier, having an input port connected to the first output port of said system clock, for filtering said clock signal to generate a dither signal with frequencies harmonically related to the clock frequency, $f_c$, for amplifying the dither signal to a selected amplitude substantially covering the input signal dynamic range of the ADC, and for transferring said dither signal to an output port;

an analog summing circuit, having a first port for receiving an analog test signal and a second input port connected to the output port of said analog filter/amplifier, for receiving said dither signal, said analog summing circuit for summing said test and dither signals to form an analog ADC input signal and for transferring said analog ADC input signal to the input port of the ADC, where the amplitude of the analog ADC input signal substantially covers the input dynamic range of the ADC, and where the dither signal is rapidly varying compared to the analog test signal; and a digital filter, having a first input port for receiving the m-bit digital ADC output signal representing said analog ADC input signal and having a second port for receiving said clock signal, with frequencies of said dither signal locked to the zeros of the digital filter to facilitate attenuation of the dither signal, said digital filters for generating an $m+(W)\Delta m$ bit digital filter output signal representing said analog test signal with $(W)\Delta m$ being the increased resolution of the system.

2. The invention of claim 1 wherein $f_s$ is harmonically unrelated to $f_c$.

3. A method for improving the accuracy of an analog to digital converter (ADC) of the type having a specified input signal dynamic range (V), and an ADC sampling frequency ($f_s$), for receiving an analog ADC input signal at an ADC input port, for generating an m-bit digital ADC output signal, and for transferring the digital ADC output signal to an ADC output port, said method comprising the steps of:

selecting an analog test signal having a predetermined amplitude range and bandwidth;

providing a clock signal having a frequency higher than any of the frequencies in the bandwidth of said analog test signal;

deriving an analog dither signal from said clock signal where the dither signal is rapidly varying compared to said analog test signal;

adding said analog dither signal to said analog test signal to form an analog ADC input signal;

controlling the amplitude of said analog dither signal so that the amplitude of said analog input ADC test signal substantially covers the input dynamic range of the ADC;

transferring said analog ADC input signal to the input port of said ADC;

digitally filtering said digital ADC output signal to reduce the amplitude of the dither signal and to increase the accuracy of the ADC; and utilizing said clock signal to clock said digital filter.

4. The invention of claim 3 further comprising the step of:

selecting the frequency of said digital filter clock signal to be harmonically unrelated to the ADC sampling frequency $f_s$.

5. The invention of claim 4 further comprising the step of:

selecting the amplitude of said dither signal to be less than $\frac{1}{2}$ of V.

6. A system for generating a digital representation of an analog test signal, s(t), comprising:

an analog to digital converter (ADC) for generating an analog ADC input signal, y(t), with said ADC characterized by a given input dynamic range;

means for generating a known dither signal, d(t); where said dither signal is rapidly varying with respect to said test signal and where the amplitude of d(t) substantially covers the given dynamic range of said ADC;

means for adding d(t) to s(t) to form said analog ADC input signal, y(t); and means for digitally filtering said m-bit digital signal to attenuate said dither signal.

7. The invention of claim 6 wherein said means for digitally filtering is characterized by a bandpass function with zeros at given frequencies.

8. The invention of claim 7 further including:

means for generating a dither signal having frequency components at frequencies locked to the zeros of said digital filtering means.

9. The invention of claim 8 wherein said means for digitally filtering is synchronized by a clock signal and wherein said means for generating a dither signal comprises:

means for filtering said clock signal; and means for amplifying said clock signal so that y(t) substantially covers the input dynamic range of said ADC.

10. A system for generating a digital representation of an analog test signal comprising:

an analog to digital converter (ADC) having a specified input signal dynamic range (V), and an ADC sampling frequency ($f_s$), for receiving an analog ADC input signal at an ADC input port, for generating an m-bit digital ADC output signal, and for transferring the digital ADC output signal to an ADC output port;

a system clock for generating a first clock signal at a clock freuency, $f_c$, and for transferring the first clock signal to a first output port and for generating a second clock signal, at clock frequency, and for transferring the second clock signal to a $f_s$, second output port;

an analog filter/amplifer, having an input port connected to the first output port of said system clock, for filtering said clock signal to generate a dither signal with frequencies harmonically related to the clock frequency, $f_c$, for amplifying the dither signal to a specified amplitude substantially covering the input signal dynamic range of said ADC and for transferring said dither signal to an output port;

an analog summing circuit, having a first input port for receiving an analog test signal and a second input port connected to the output port of said analog filter/amplifier, for receiving said dither signals, said analog summing circuit for summing said test and dither signals to form an analog ADC input signal and for transferring said analog ADC input signal to the input port of the ADC, where the amplitude of the analog ADC input signal substantially covers the input dynamic range of the ADC and where the dither signal is rapidly varying compared to the analog test signal; and a digital filter, having a first input port for receiving the m-bit digital ADC output signal representing said analog ADC input signal and having a second port for receiving said clock signal, with frequencies of said dither signal locked to the zeros of the digital filter to facilitate attenuation of the dither signal, said digital filter for generating an $m+(W)\Delta m$ bit digital filter output signal representing said analog test signal with $(W)\Delta m$ being the increased resolution of the system.

11. The invention of claim 10 wherein $f_s$ is harmonically unrelated to $f_c$.